United States Patent [19]

Dunkley et al.

[11] Patent Number: 4,496,963

[45] Date of Patent: Jan. 29, 1985

[54] SEMICONDUCTOR DEVICE WITH AN ION IMPLANTED STABILIZATION LAYER

[75] Inventors: James L. Dunkley, Santa Clara; Robert C. Dobkin, Atherton, both of Calif.

[73] Assignee: National Semiconductor Corporation, Santa Clara, Calif.

[21] Appl. No.: 19,135

[22] Filed: Mar. 9, 1979

Related U.S. Application Data

[63] Continuation of Ser. No. 716,049, Aug. 20, 1976, abandoned, which is a continuation of Ser. No. 575,418, May 7, 1975, abandoned, which is a continuation of Ser. No. 377,611, Jul. 9, 1973, abandoned.

[51] Int. Cl.$^3$ .......................................... H01L 29/80
[52] U.S. Cl. ........................................ 357/22; 357/52; 357/91
[58] Field of Search .................. 357/22, 91, 52

[56] References Cited

U.S. PATENT DOCUMENTS

| | | | |
|---|---|---|---|
| 2,954,486 | 9/1960 | Doucette et al. | 357/22 |
| 3,223,904 | 12/1965 | Warner et al. | 357/22 |
| 3,335,342 | 8/1967 | Leistiko et al. | 357/22 |
| 3,383,567 | 5/1968 | King et al. | 357/91 |
| 3,538,399 | 11/1970 | Bresee et al. | 357/22 |
| 3,656,031 | 4/1972 | Bresee et al. | 357/22 |

Primary Examiner—Joseph E. Clawson, Jr.
Attorney, Agent, or Firm—Gail W. Woodward; Paul J. Winters; Michael J. Pollock

[57] ABSTRACT

A semiconductor device wherein surface stabilization is provided by a shallow layer of ion implanted doping material on the surface of the semiconductor and beneath the passivating oxide layer. One embodiment is a bipolar transistor including a collector region, a base region and an emitter region, the base region being provided with the shallow ion implanted layer at the surface thereof. Another embodiment is a zener diode device with an anode region and a cathode region, the cathode region being provided with the shallow ion implanted layer at the surface thereof. Another embodiment is a JFET with a gate region and a source and drain region and a channel region extending through the gate region between the source and drain regions, the channel region being provided with the shallow ion implanted layer at the surface thereof.

6 Claims, 6 Drawing Figures

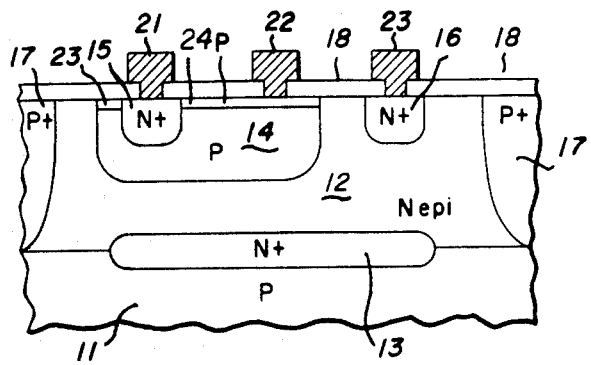
Fig_1
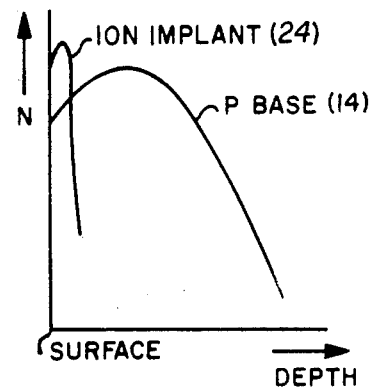
Fig_2
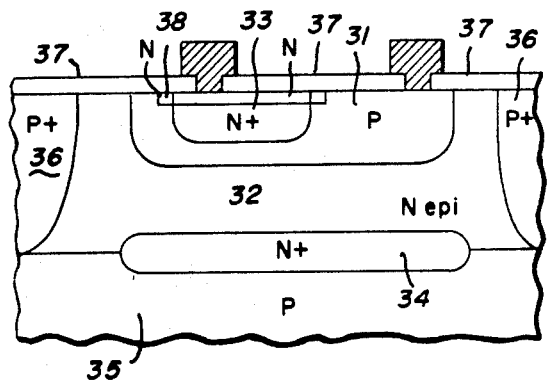
Fig_3
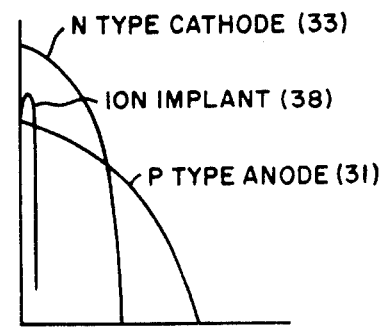
Fig_4
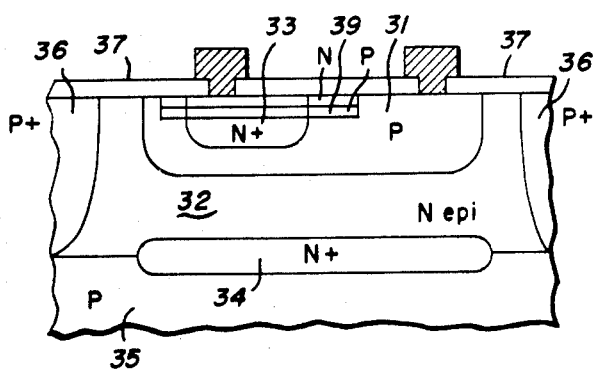
Fig_5
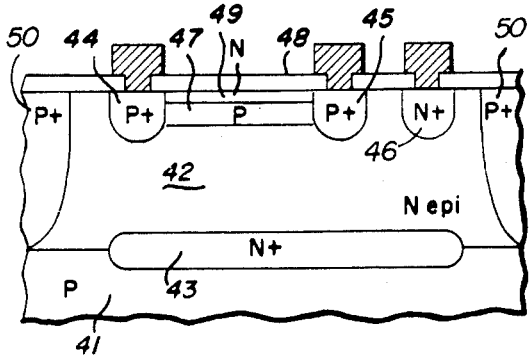
Fig_6

SEMICONDUCTOR DEVICE WITH AN ION IMPLANTED STABILIZATION LAYER

This is a continuation of application Ser. No. 716,049, filed Aug. 20, 1976, which is in turn a continuation of Ser. No. 575,418, filed May 7, 1975, which is in turn a continuation of Ser. No. 377,611, filed July 9, 1973, all abandoned.

BACKGROUND OF THE INVENTION

Oftentimes semiconductor devices suffer from instabilities at their surface, resulting in a degradation in their performance, including noise characteristics. One source of such instability is the interface between the dielectric layer on the surface, i.e. the passivating glass layer of silicon dioxide, and the surface of the semiconductor body. This interface can be a source of surface states that produce noise, the value of such surface states being commonly referred to as $Q_{ss}$, with representative values of $1 \times 10^{11}$ to $1 \times 10^{12}$ states or effective charges per square centimeter.

A second source of such instability occurs when the surface of the semiconductor has a relatively light doping of one conductivity, and the oxide layer on the surface has a relatively high number of mobile ionized impurities of either polarity. These impurities act to enhance, deplete or even invert the lightly doped semiconductor surface, thus altering the character of the surface and producing noise, drift, or channeling. For example, in a bipolar transistor with an N+ emitter diffusion in a P type base region, the P type base region, which may, for example, be made of a boron diffusion, may lose some of the boron at its surface during the oxidation layer processing since boron diffuses readily into silicon dioxide. The reduction of doping at the surface can then result in additional depletion due to positive ions or carriers in the oxide layer, for example positive sodium ions, and can even result in an inversion at the surface. Such surface depletion or inversion produces an effect commonly referred to as "channeling", where a short circuit is produced between the collector and the emitter through the base surface region.

Also, in zener diodes, the breakdown or avalanching occurs at the surface of the semiconductor body, where the peak of the impurities of the cathode diffusion region is located. Any mobile ionized impurities found in the silicon dioxide passivating layer on the surface can change the electric field distribution at the surface, resulting in a drift in the breakdown voltage.

SUMMARY OF THE PRESENT INVENTION

The present invention provides a novel method and apparatus whereby the surface of a semiconductor body beneath the passivating glass layer may be stabilized and the operating characteristics of the device, including the noise performance, enhanced. Basically the invention provides an ion implanted layer of the same conductivity type of the semiconductor, this layer being of a relatively high concentration and very shallow, of the orer of $0.1\mu$, to raise the impurity concentration at the surface of the semiconductor body. This ion implantation layer stabilizes the surface of the semiconductor, making it insensitive to both the ionized impurity contamination in the silicon dioxide and the surface states created between the silicon dioxide layer and silicon body.

In one embodiment of the invention, the ion implanted layer is utilized in a bipolar transistor to isolate the base diffusion region from the passivating layer to prevent channeling through the base region at the surface between the emitter region and the collector region.

In another embodiment of the invention, the ion implanted layer is utilized in a zener diode structure to isolate the silicon dioxide layer from the semiconductor body and thereby isolate the region at which breakdown occurs from the silicon dioxide layer, so that impurities in the silicon dioxide layer have little or no effect on the breakdown characteristics of the device.

In still another embodiment of the invention, the ion implanted layer is utilized in a field effect transistor (FET) to prevent mobile positive ions in the silicon dioxide surface layer from depleting or inverting the channel region at the surface.

BRIEF DESCRIPTION OF THE DRAWINGS

FIG. 1 is a cross section view of an NPN transistor employing the ion implanted stabilization layer of the present invention.

FIG. 2 is an impurity profile of the base region and ion implanted layer of the device of FIG. 1.

FIG. 3 is a cross-section view of a form of zener diode employing the present invention.

FIG. 4 is an impurity profile of the cathode, anode, and ion implanted layer of the device of FIG. 3.

FIG. 5 is a cross section view of another form of zener diode employing the present invention.

FIG. 6 is a cross section view of one form of field effect transistor employing the ion implanted layer of the present invention.

DESCRIPTION OF THE PREFERRED EMBODIMENTS

Referring to FIG. 1 there is shown in cross-section view a bipolar transistor comprising a P type substrate 11 with an N epitaxial layer 12 thereon and an N+ buried layer 13. A P diffused base region 14 is formed in the N epitaxial region 12 with an N+ emitter region 15 formed in the base region 14; an N+ collector contact region 16 is formed in the N epitaxial region. Isolation regions 17 of P+ material are formed about the transistor. The surface is provided with an oxide layer 18, for example silicon dioxide, and emitter, base and collector contacts 21, 22 and 23, respectively, contact their associated regions through the oxide layer.

In those instances where the base region 14 near the surface is lightly doped, for example, an impurity concentration of $10^{17}$ to $10^{18}$ atoms/cm$^3$, and where the oxide layer 18 contains ionized impurities, such as positive sodium ions, the positive impurities in the oxide surface layer may deplete or even invert the base region at the surface. This creates what is known as "channeling", a low conductivity path between the collector region 12 and the emitter 15 through the base region 14 at the surface.

Referring to FIG. 2 there is shown an impurity profile of the base region 14 with impurity concentration (N) along the ordinate and the distance into the semiconductor from the surface being taken along the abscissa. From this profile it can be seen that the impurity concentration at the surface falls off from a peak value below the surface. One cause for this, in the case of a boron diffusion, is that the boron readily flows out of the semiconductor body and into the silicon dioxide during the formation of the oxide layer 18, thus tending to deplete the P material in the surface of the base.

In accordance with this invention additional P type impurities, for example boron, are placed in the P base region prior to or even following the formation of the oxide layer in a relatively high concentration and in a very shallow depth surface layer 23. This layer 23 is formed by the well known technique of ion implantation (see, for example, the article by J. F. Gibbons, Proc. of IEEE, Vol. 56, page 295, 1968).

An ion implantation apparatus of known type includes a means for applying a high voltage alternating electrical field, for example, 15 KEV, on a gas containing the doping atom desired, for example boron in the gas $BH_2$, to ionize the boron in the gas. The gas is accelerated through a mass separator including a magnetic field to separate out the ionized boron atoms and direct them through a linear accelerator with an accelerating potential of from 20 KEV to 150 KEV. The beam of positive boron atoms exits the accelerator and is swept over the silicon wafer to implant the boron ions in the region 23 defined by the opening in the mask. The beam of ionized boron atoms can be monitored very accurately so that the amount of boron atoms implanted and also the exact depth of the implant layer can be controlled very accurately by proper selection of the accelerating voltage. The impurity profile of the boron ion implant peaks at a point just below the surface as illustrated by the curve in FIG. 2, the total depth of this ion implant being about $0.1\mu$ and the average concentration being typically $10^{13}$ to $10^{20}$ atoms/cm$^3$. This ion implant layer eliminates any tendency for channeling beneath the oxide layer 18.

Referring now to FIG. 3 there is shown a cross-section view of a form of zener diode wherein the anode region 31 is a P type diffusion in an N epitaxial region 32, region 31 being formed during the base diffusion stage in the fabrication of bipolar transistors in an IC circuit. The cathode region 33 is an N+ type diffusion formed during the emitter diffusion stage. The conventional N+ buried layer 34 between the P substrate 35 and the N epitaxial layer 32 as well as the isolation regions 36 are also shown.

The surface of the semiconductor body suffers from at least two sources of instability, leading to degradation in the noise characteristics in the device. One source of instability is the interface between the surface of the silicon body regions 31 and 33 and the undersurface of the silicon dioxide passivating layer 37. This interface can be the source of surface states or charges that produce noise in the device. Since the impurity concentration of the N+ cathode region 33 peaks at the surface of the semiconductor, as seen by the trace of FIG. 4, the breakdown or avalanching of the zener diode occurs at the surface. With breakdown occurring right at the surface, the surface states present at the interface between the semiconductor body and the silicon dioxide layer 37 tend to produce noise in the operation of the zener diode.

In addition, any impurities in the oxide layer itself, such as positive sodium or negative hydroxel ions, tend to move under the influence of the electric fields at the surface, and the drifting of these positive ions changes the electric field distribution at the surface, causing the breakdown or avalanching voltage to change with time.

By utilizing a very shallow N type ion implant, for example a phosphorous implant at 20 KEV to give a total depth of implant of about $0.1\mu$ with an average impurity concentration of $10^{18}$ to $10^{20}$ atmos/cm$^3$, the point of breakdown can be moved to the interface between this very shallow implant layer 38 and the anode diffusion layer 31 and away from the oxide layer 37. This has the effect of making a metallurgically stable surface at the breakdown point which is isolated from both the silicon dioxide-semiconductor body interface and the mobile positive carriers in the silicon dioxide layer 37.

Another embodiment of the present invention as utilized in a zener diode is shown in FIG. 5. The zener diode is similar to that shown in FIG. 3 except that there is included a first ion implant layer 39 which is of P type material, this first ion implant layer being utilized to move the P impurity concentration peak below the surface of the semiconductor body so that breakdown or avalanching will occur at this lower level. This ion implant layer is described and claimed in U.S. patent application Ser. No. 377,610 filed July 9, 1973, now U.S. Pat. No. 4,079,402 by James L. Dunkley and James. E. Solomon entitled "A Zener Diode Incorporating An Ion Implanted Layer Establishing The Breakdown Point Below The Surface". The peak concentration of the layer 39 is about $10^{18}$ to $10^{20}$ atoms/cm$^3$ and the peak appears about $0.5\mu$ below the surface in a typical example. The second added N type ion implant layer 38 of the present invention then serves to stabilize the surface of the device and reduce noise.

Another embodiment of this invention is shown in the field effect transistor (FET) of FIG. 6 wherein the P type substrate 41 has an N epitaxial layer 42 thereon and includes the N+ buried layer 43 and P+ isolation regions 50. A P+ type source region 44 and P+ type drain region 45 are diffused into the N epitaxial region 42, with an N+ gate contact region 46 also diffused into the N epitaxial gate region. A P channel region 47 is formed in the gate region 42 between the source 44 and the drain 45 by diffusion technology or by an ion implantation technique as described in U.S. patent application Ser. No. 377,609 filed on July 9, 1973 by James L. Dunkley and James E. Solomon entitled "A Junction Field Effect Device Comprising A Shallow Ion Implanted Layer Forming The Channel Region", now abandoned. In the case of the ion implanted P channel region, the layer depth is typically about $0.5\mu$ to the peak concentration of the implant and about $1\mu$ thick overall. In a typical device, the average concentrations are about $10^{18}$ atoms/cm$^3$ to $10^{19}$ atoms/cm$^3$ for the source 44 and drain 45, $10^{15}$ to $10^{17}$ atoms/cm$^3$ for the epitaxial region 42, and $10^{15}$ to $10^{16}$ atoms/cm$^3$ for the P channel 47.

Noise is generated in the device, due, for example, to charges existing in the silicon dioxide layer 48 which act to deplete or even invert the lightly doped channel region 47 at the surface, thus forming a very shallow N layer on the surface. This induced top gate alters the characteristics of the device, making the surface region unstable and susceptible to noise generation. An N type ion implant 49, for example, a phosphorous ion implant of suitable shallow depth, e.g. $0.1\mu$ deep with a concentration of about $1 \times 10^{12}$ atoms/cm$^2$, stabilizes the surface region and eliminates the noise in accordance with the present invention.

It should be noted that, although these embodiments were explained as being utilized in NPN devices, this invention is also equally applicable to PNP devices.

What is claimed is:

1. A planar junction field effect transistor comprising:

a substrate of a first type conductivity, a first layer of a second type conductivity on said substrate forming a gate region, a source region of said first type conductivity in said layer at the surface thereof, a drain region of said first type conductivity in said layer at the surface thereof and separated from said source region, an ion implanted channel region of said first type conductivity in said layer extending between said source and drain regions, an insulating layer on the surface of said first layer and overlying said channel region, an ion implanted stabilization layer of said second type conductivity disposed on top of said channel region at the surface of said first layer and located between said channel region and said insulation layer, said stabilization layer extending between said source region and said drain region and having a dopant concentration higher than the dopant concentration in said channel region and acting to stabilize the channel region and reduce noise in the transistor, and contact means at the surface of said first layer making electrical contact with said source region, said drain region, and said gate region.

2. A planar junction field effect transistor as claimed in claim 1 wherein said first type conductivity is P type and said second conductivity is N type.

3. A planar junction field effect transistor as claimed in claim 2 wherein said channel region depth in said first layer is about 1 micron and the depth of said stabilization layer in said first layer in about 0.1 micron.

4. A planar junction field effect transistor comprising:
a substrate of a first type conductivity,
an epitaxial layer of a second type conductivity forming a gate region grown on said substrate,
a buried layer of said second type conductivity lying between the epitaxial layer and the substrate, a source region of said first type conductivity diffused in said epitaxial layer at the surface thereof, a drain region of said first type conductivity diffused in said epitaxial layer at the surface thereof and seperated from said source region, an ion implanted channel region of said first type conductivity in said epitaxial layer extending between said source and drain regions, an insulating layer on the surface of said epitaxial layer and overlying said channel region, an isolation region of said first type conductivity material in said epitaxial layer and surrounding said gate region, said source region, and said drain region, an ion implanted stabilization layer of said second type conductivity diposed on top of said channel region at the surface of said epitaxial layer and located between said channel region and said insulation layer, said stabilization layer extending between said source region and drain region and having a dopant concentration higher than the dopant concentration in said channel region and acting to stabilize the channel region and reduce noise in the transistor, and contact means at the surface of said epitaxial layer making electrical contact with said source region, said drain region, and said gate region.

5. A planar junction field effect transistor as claimed in claim 4 wherein said first type conductivity is P type and said second type conductivity is N type.

6. A planar junction field effect transistor as claimed in claim 5 wherein said channel region depth in said epitaxial layer is about 1 micron and the depth of said stabilization layer in said epitaxial layer is about 0.1 micron.

* * * * *